Figure 4:
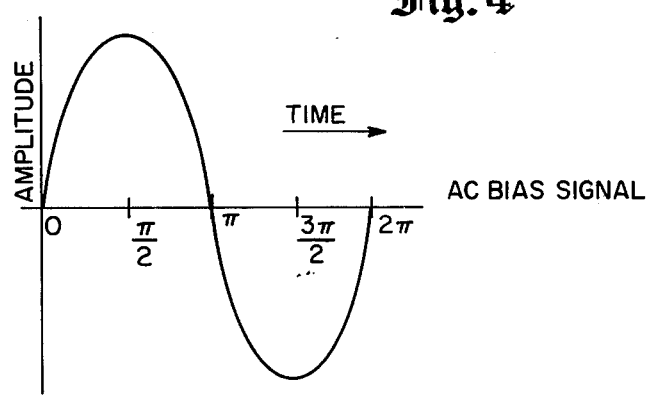

United States Patent [19]

Flora

[11] 4,050,012
[45] Sept. 20, 1977

[54] DUAL BIASED STATIC SENSING MAGNETIC TRANSDUCER

[76] Inventor: James D. Flora, 7067-1/2 Vineland Ave., North Hollywood, Calif. 91605

[21] Appl. No.: 565,105

[22] Filed: Apr. 4, 1975

[51] Int. Cl.² ............................................. G01R 33/02
[52] U.S. Cl. .................................... 324/43 R; 360/123
[58] Field of Search ................. 324/43 R, 47, 34 R; 360/110, 111, 112, 113, 119, 120, 123

[56] References Cited

U.S. PATENT DOCUMENTS 3,435,440  3/1969  Nallin ................................. 360/115

FOREIGN PATENT DOCUMENTS 749,162  5/1956  United Kingdom .............. 324/43 R

OTHER PUBLICATIONS

Nallin, E. J., Multitransducer Magnetic Head, IBM Tech. Bull., vol. 8, No. 10, Mar. 1966, pp. 1315–1316.

Primary Examiner—Robert J. Corcoran
Attorney, Agent, or Firm—John B. Miller, Jr.

[57] ABSTRACT

A dual biased magnetic transducer capable of sensing magnetically recorded data on a magnetic medium without any relative velocity between the transducer and the medium. The transducer includes a third DC bias field for aiding the DC field created by the data on the medium for substantially shifting the level in the AC carrier, thereby producing a computer compatible intelligible signal.

5 Claims, 6 Drawing Figures

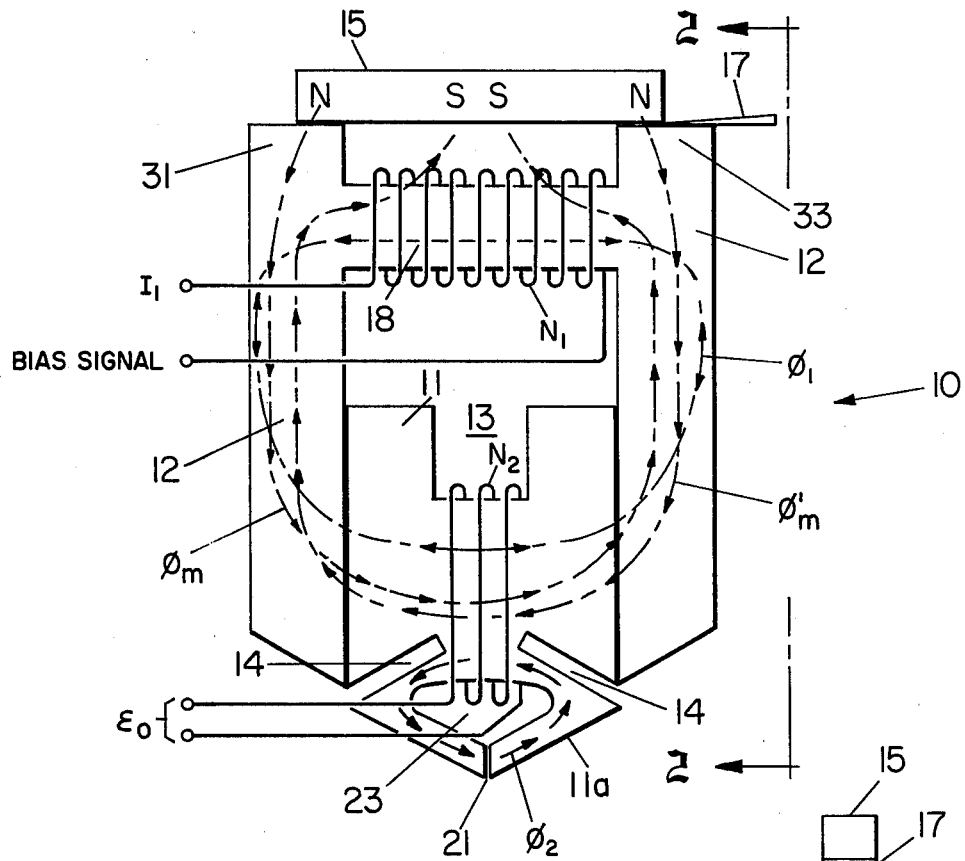
Fig. 1
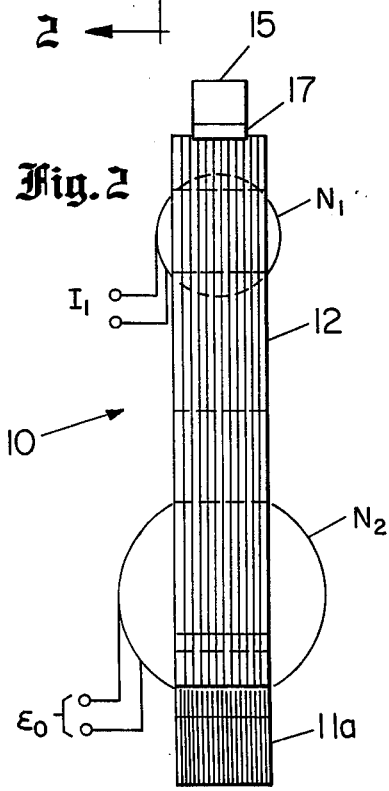
Fig. 2
Fig. 3

DUAL BIASED STATIC SENSING MAGNETIC TRANSDUCER

The present invention relates to a magnetic transducing device and, more particularly, to a magnetic transducer head for recording and reproducing signals on a magnetic recording media.

Over the past 15 years, the art of electromagnetic transducers for recording upon, and detecting data from a magnetic medium has developed extensively. Most of the prior art transducers are dynamic in nature, that is, in order to produce an output signal corresponding to the data magnetically recorded upon the medium, during the detecting or sensing operation (commonly called "reading"), there must exist some relative velocity between the transducer and the medium.

For more than 10 years, an effort has been made by various scientists to develop a magnetic transducer (often called a "head") which is capable of sensing binary-coded digital data recorded on a magnetic medium without destroying (also called "erasing") the sensed data and further without any relative motion between the transducer and the medium in order to produce the output signal. Such transducers are called static sensing magnetic transducers capable of nondestructive readout. For the most part, such efforts in the prior art have been without substantial success.

For example, static heads are known in the prior art which rely on a change in the magnetic reluctance of the back-gap to produce an output signal corresponding to the data being sensed; but such heads are not suited to the high packing densities used in present magnetic digital recording because they employ mechanical or electrical means of varying the back-gap reluctance. With mechanical means, for example, density of data recorded on the medium is extremely limited. Because the data is randomly recorded on the medium, with a moving medium, the movement of the medium must be synchronized with the movement of the mechanical means for varying the back-gap reluctance of the head. If a synchronization mechanism is not provided, there is an extremely low signal-to-noise ratio resulting in the output signal. The expense of the synchronization mechanism also renders this approach undesireable. With electrical means for varying the back-gap reluctance of the head, the tendency of such electrical means is to erase the data (pre-recorded on the medium) as the transducer reads the data.

In an attempt to overcome these problems associated with prior art statically sensing transducers, I invented a static sensing transducer primarily suited for reading data vertically recorded (that is, unipolar) on the medium, as described in my U.S. Pat. No. 3,651,502, entitled MAGNETIC SENSING TRANSDUCER WITH A FLAT UNITARY LAMINATE CORE STRUCTURE. In such structure, however, I have subsequently discovered a number of structural and technical defects which have precluded that transducer's successful use in statically reading magnetically recorded data from the medium without relative velocity of approximately 2 inches-per-second (i.p.s.) between the transducer and the medium. With relative velocities below 2 i.p.s., the output signal produced by my prior art transducer is extremely weak and the ratio between the output voltage representing a logical 1 recorded on the associated magnetic medium and the output voltage representing a logical 0 recorded on the medium is in the area of 1.1:1.

Further research led me to several important discoveries concerning the transducer of my above-referenced invention. First: Although I believe that the transducer's sensitivity to extraneous fields emitted by magnetically recorded data was related to resultant flux that generated the output signal $E_o$, I have discovered that a shift in the level of the bias signal $I_1$ was what was being sensed. Second: I discovered that, in order to read data horizontally recorded (bipolar) on the magnetic medium, a gapped head was necessary; but in the structure of my earlier invention, such a gap at the apex of the head had to be so wide that the density of data recorded on the medium was significantly reduced to approximately five bits-per-inch (BPI). I concluded, therefore, that the transducer of my above-referenced patent was incapable of sensing densely packed horizontally recorded data because insufficient flux from each bit of such data reached the sense or "read/write" coil $N_2$ to generate a signal that would cause any significant change in the level of the output signal generated by the bias winding, especially at zero relative velocity between the transducer and the medium. With some relative velocity between the medium and the transducer, the rate of change in the field from the data on the medium increases to induce a greater voltage in the sense coil sufficient to cause a small level change in the output signal $E_o$.

It is, therefore, an object of the present invention to provide a greatly improved magnetic transducer equally capable of statically or dynamically sensing data horizontally or vertically recorded on a magnetic medium.

It is another object of the present invention to provide a high and greatly improved signal-to-noise ratio in the output signals produced by statically sensed data recorded on a magnetic medium.

It is still another object of the present invention to confine the magnetic fields used for biasing the transducer to locations away from the magnetic medium to prevent erasure of data during a read operation.

Still another object of the present invention is to increase the ratio between voltage levels in the transducer output signal representing a logical 1 and a logical 0, respectively, recorded on a magnetic medium.

Yet another object of the present invention is to reinforce flux reversals in or through the sense coil produced by magnetically recorded data on a magnetic medium.

These and other objects and advantages are accomplished in accordance with features of the present invention by a static sensing magnetic transducer employing a third aiding DC field to bias the transducer core material for operation on a minor hysteresis loop. The core geometry within the transducer of the present invention is uniquely constructed to restrict the flux of the DC bias field and an AC bias field to a selected low reluctance path and steer the bias flux away from the magnetic recording medium, thereby preventing destructive readout of data recorded on the medium. During static sensing, lines of flux from the DC field emanating from the bit of data on the medium being sensed pass through the sense coil. The flux from the magnetic field on the medium is thereby sensed by the sense coil causing a shift in the minor hysteresis loop and a concommitant change in the point of operation on the permeability slope of the core material resulting in an increase in the voltage induced in the sense winding. At zero velocity between the transducer and the medium, an output signal is generated in the sense winding by the time-varying electromagnetic field generated by the AC bias signal applied to a bias coil wound around a control block in which the transducer's core is located. The increase in the voltage induced in the sense winding by the field from data on the medium is sufficient to produce a substantial shift in the level of the signal generated by the time-varying bias field so as to make a signal level representing a 1 easily distinguishable from another signal level representing a logical 0 recorded on the medium.

As is obvious to one skilled in the art, to record (that is, "write") digital data upon the magnetic medium using the transducer of the present invention, the bias signal is removed from the bias coil and the signal containing the data to be written upon the medium is applied to the sense winding. Whether the data is recorded on the medium vertically or horizontally, the transducer of the present invention, at zero i.p.s. velocity between the medium and the transducer, is able to nondestructively read extremely high density magnetic data. For example, the transducer of the present invention can statically read horizontally recorded data bits having wavelengths of only 60 micro-inches.

The novel features which are believed to be characteristic of the present invention, both as to its organization and method of operation, together with further objects and advantages thereof, will be better understood from the following description considered in connection with the accompanying drawings in which one embodiment of the invention is illustrated by way of example. It is to be expressly understood, however, that the drawings are for the purpose of illustration and description only and are not intended as a definition of the limits of the invention.

Figure 5:
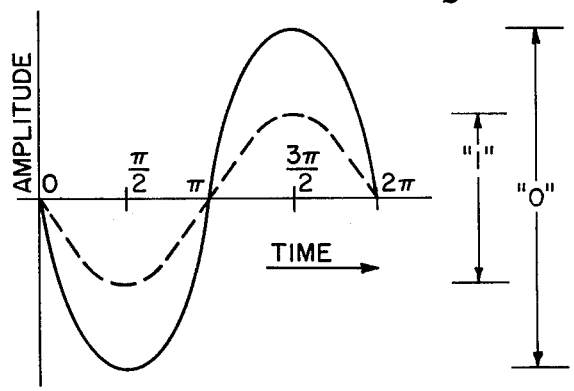
Figure 6:
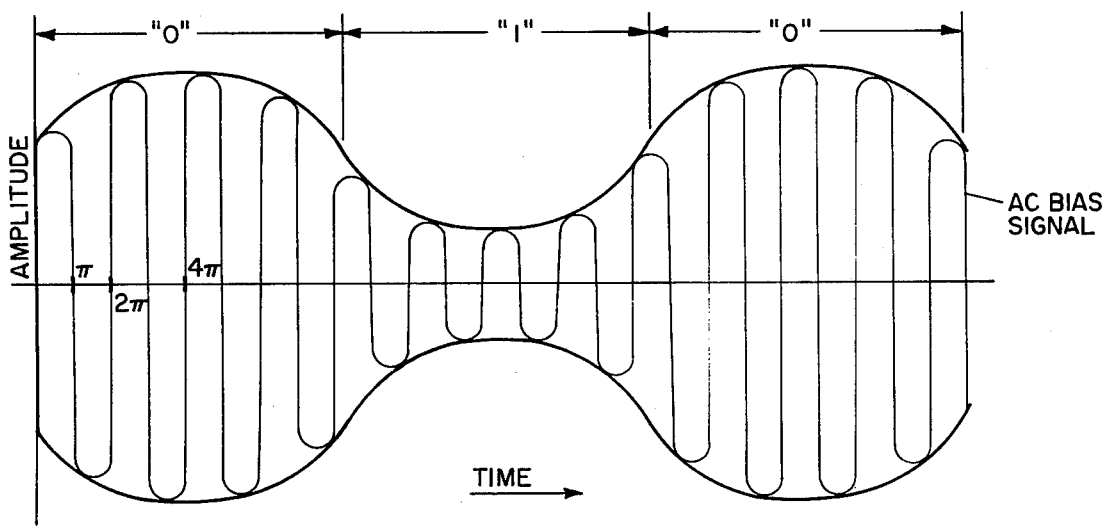

In the drawings:

FIG. 1 schematically illustrates a dual biased, static sensing magnetic transducer of the present invention showing magnetic fields established within the transducer;

FIG. 2 schematically illustrates a side view of the transducer shown in FIG. 1, taken along the line 2—2;

FIG. 3 schematically illustrates three different DC bias field generators, and each of their electrical equivalent circuits, as may be employed within the transducer of the present invention illustrated in FIGS. 1 and 2;

FIG. 4 is a waveform diagram illustrating an AC bias signal which is applied to one winding within the transducer illustrated in FIGS. 1 and 2;

FIG. 5 is a waveform diagram illustrating an output signal derived by a second sense winding within the transducer illustrated in FIGS. 1 and 2, the output signal being generated while there is no relative velocity between the transducer and the magnetic medium being sensed thereby; and FIG. 6 is a waveform diagram illustrating an output signal derived by said second sense winding within the transducer shown in FIGS. 1 and 2, the output signal shown in FIG. 6 being generated with some relative velocity between the transducer and the magnetic medium being sensed thereby.

With reference to the drawings, there is schematically shown in FIG. 1 a dual bias, static sensing magnetic transducer 10 constructed in accordance with the teachings of the present invention to include a uniquely constructed core 11 positioned within a control block 12.

The core 11 is configured to have a notch or recess 13 in the top thereof and a ring-shaped tip 11a machined or formed on the lower extremity of the core 11 body. The ring-shaped tip 11a of the core 11 is created by an aperture 23 and two slots 14 in the lower extremity of the core 11. The aperture 23 is centrally located at the lower extremity of the core 11 and the slots 14 extend upwardly at an angle from the opposite sides toward the center of the core 11. The slots 14 act as high reluctance gaps or paths for magnetic flux to divert flux generated by an AC and DC bias away from the tip 11a.

As can be seen from FIGS. 1 and 2, a coil $N_1$ (hereinafter called the "bias winding $N_1$") is wound around a cross-member 18 of the control block 12, the cross-member 18 extending between two bifurcated legs 31 and 33 of the control block 12 at the upper extremity thereof. A coil $N_2$ (hereinafter called the "sense winding $N_2$") is wound around the core 11 through the notch 13 and the aperture 23 so that the ring tip 11a passes through the sense coil $N_2$ as does the main body of core 11. The sense winding $N_2$ should be at least in part close to the medium. It should be noted that the core 11 is tightly positioned between the lower extensions of the bifurcated legs 31 and 33 of the control block 12 so as to form a low reluctance path for magnetic flux across the junctions between the legs 31 and 33 and the body of core 11.

Bridging the upper extremities of legs 31 and 33 of control block 12, as shown in FIGS. 1 and 2, is positioned one type of DC bias field generator 15 that may be employed within the transducer 10 of the present invention. The DC bias field generator 15 is illustrated as having a wedge-shaped shim 17 wedged between one end of the DC bias field generator 15 and the top of leg 33 of the control block 12 for controlling the strength of the DC bias field passing through the control block 12. As will be appreciated by those skilled in the magnetics art, the shim 17 is fabricated of a high reluctance material and is wedged to a greater or lesser degree between the pole of the DC bias field generator 15 and the leg 33, thereby moving the pole away from or close to, respectively, the control block 12, causing a high reluctance gap therebetween. The shim 17, in the magnetic art, operates analagously to a resistor, in the electrical art, connected in series with a voltage source to decrease the current flowing in the electrical circuit.

As illustrated in FIG. 3, the DC bias field generator 15 may be one of many forms. For sensing vertically recorded data on a medium, transducer 10 ideally should employ a unipolar DC bias field generator as schematically illustrated in FIG. 3(a), which may be in either the form of a permanent magnet or an equivalent coil. If the coil form of unipolar DC bias field generator 15 is employed, the shim 17 would not be required since the strength of the DC bias field generated thereby would be established by increasing or decreasing the amount of direct current applied to the coil of the DC bias field generator. On the other hand, for sensing vertically recorded data on a medium, transducer 10 could employ a bipolar DC bias field generator as schematically illustrated in FIGS. 3(b) or 3(c) and then creating an imbalance between the fields emanating from each pole tip. In the coil form of generator shown in FIG. 3(b), an imbalance is created by applying greater current to one-half of the coil then the other. In the coil form of generator shown in FIG. 3(c), an imbalance is created by making more windings on one side of the coil than on the other. With either permanent magnet form of generator, an imbalance is created by shimming one pole away from the control block, as described above. As is obvious to one skilled in the art, the bipolar DC bias field generators illustrated in FIGS. 3(b) and 3(c) are best suited for application or use in the transducer 10 of the invention for sensing data horizontally recorded on the medium.

Referring again to FIG. 2, it can be seen that the control block 12 may be composed, for example, of numerous laminates of appropriate magnetic material, such as high nickel alloy, or other suitable magnetic permeable material. It should also be recognized that the control block 12 may be fabricated in a solid ferrite form, which form would be advantageous for producing greater sensitivity if the density of the data being sensed on the magnetic medium approaches 1.5 megahertz. Similarly, the core 11 is shown in FIG. 2 to be a laminated construction having a thickness equal to the control block, but this is not a necessary feature. The thickness of the core 11 (of which the tip 11a is an integral part, as explained above) is a function of the track width of the data recorded upon the medium. In one embodiment of the present invention described herein, twenty such laminates were used to produce a thickness of 0.040 inches.

Still referring to FIG. 2, while the bias winding $N_1$ and the sense winding $N_2$ are shown to be circularly wound around the cross-member 18 and the core 11, it will be recognized by those skilled in the art that such coils in practice could take different forms, such as, for example, elliptical.

During a static read operation using the static sensing transducer 10 of the present invention, a time-varying bias signal $I_1$ as shown in FIG. 4 is applied to the bias winding $N_1$. In response to this bias signal $I_1$, the bias winding $N_1$ generates a time-varying electromagnetic field $\phi_1$ which, along with the other fields, is illustrated ideally in FIG. 1 ignoring fringing flux. Flux from the time-varying bias field $\phi_1$ passes through the legs 31 and 33 of the control block 12, across the low reluctance gap between the control block 12 and the core 11, through the core 11 and the sense winding $N_2$ wound therearound. In response to the passage of the lines of flux of the time-varying electro-magnetic field $\phi_1$ through the sense winding $N_2$, a signal is induced in the sense winding, the amplitude of which can be controlled by increasing or decreasing the bias current $I_1$ flowing in the bias winding $N_1$. Simultaneously, lines of flux $\phi_m$ and $\phi_m'$ from the DC bias generator 15 pass down through the legs 31 and 33 of the control block 12, and through the core 11 and the sense winding $N_2$. The effect of these flux lines $\phi_m$ and $\phi_m'$ of the DC bias field is to bias the core 11 material for operation on a minor hysteresis loop of the material. As can be seen from FIG. 1, the high reluctance gaps 14 in the core 11 steer the AC bias field $\phi_1$ and the DC bias field $\phi_m$ and $\phi_m'$ away from the tip 11a.

As a bit of data magnetically recorded on a medium comes in close proximity to the tip 11a, lines of flux $\phi_2$ from this extraneous field are coupled into the ring-tip 11a, which is shown to contain a high reluctance gap 21, which may be, for example, only 30 micro-inches in length. The lines of extraneous flux $\phi_2$ from data on the medium pass through the ring-tip 11a and through the sense winding $N_2$. Since these lines of flux $\phi_2$ are also from a DC field on the medium, a shift in the minor hysteresis loop of the core 11 material is caused to occur, thereby causing a concomitant change in the point of operation on the permeability slope of the core 11 material and resulting in an increase in the voltage induced across the sense winding $N_2$. The increase in the voltage induced in the sense winding $N_2$ is sufficient to produce a substantial shift in the level of an output signal $E_o$ across the sense winding $N_2$, as shown in FIG. 5. For a logical 0 recorded on the medium, flux $\phi_2$ passes through the sense winding $N_2$ from the medium, and the output signal $E_o$ is not diminished. However, for a logical 1 recorded on the medium, the flux $\phi_2$ coupled from the extraneous field on the medium is sufficient to diminish the output signal $E_o$ by approximately 30-60%. Additionally, the output signal $E_o$ is caused to oscillate about a level displaced above or below 0 volts depending upon the polarity and strength of the flux $\phi_m$ from the DC bias field.

When the transducer 10 of the present invention is used to dynamically sense magnetic data recorded on a medium placed in coupled relationship to the tip 11a, that is, there is relative velocity between the transducer 10 and the medium, an amplitude modulated output signal $E_o$ is developed across the sense winding $N_2$ by the flux $\phi_1$ from the AC bias winding $N_1$, the flux $\phi_m$ and $\phi_m'$ from the DC bias generator 15 and the flux $\phi_2$ from the bits of data magnetically recorded on the medium all simultaneously passing through the sense winding $N_2$. Such a waveform for a dynamically sensed pattern of data is illustrated, for example, in FIG. 6, wherein the lower levels of the envelope represent a logical 1 recorded on the medium and the higher levels of the envelope represent a logical 0 recorded on the medium. Again, as statically, a 30-60% diminution in the envelope level representing a logical 0 can be achieved with the transducer 10 of the present invention to represent a logical 1 recorded on the associated medium. As described above, the amplitude modulated output signal $E_o$ shown in FIG. 6 would oscillate about a level displaced above or below 0 volts depending upon the polarity and strength of the flux $\phi_m$ from the DC bias field.

From the foregoing, it is clear that the output signal $E_o$ developed across the sense winding $N_2$ by the AC bias flux $\phi_1$, the DC bias flux $\phi_m$ and the flux $\phi_2$ from the magnetic data on the associated medium passing through the sense winding $N_2$ would be coupled to an amplifier and circuitry for distinguishing between the logical 1 and 0 levels in the output signal $E_o$.

Since static and dynamic writing, that is, recording of digital data upon a magnetic medium, have not been problems in the prior art transducers, suffice it to say that the transducer 10 of the present invention may also be used to write data upon a magnetic medium by diminishing the AC bias signal $I_1$ to zero and applying the write signal (containing the digital data) to the sense winding $N_2$. Lines of magnetic flux are thereby caused to flow in the ring-tip 11a and are coupled to the medium for aligning the domains thereon to form tracks of data bits, as is well known to those skilled in the art.

While a particular embodiment of the present invention has been described and shown, the transducer of the invention is also applicable to other uses and constructions. For example, and not by way of limitation, the transducer 10 described above may be used for analog recording and playback on magnetic tape where recording must necessarily be done at slow tape speeds, for providing increased resolution using the AC bias signal as a carrier during the record mode. Still further, those skilled in the art will readily appreciate that the control block 12 need not take the configuration described above and shown, but rather may be of numerous shapes so long as a low reluctance path is provided from the AC and DC bias generators through the sense winding. Other means may also be suggested by those skilled in the art for diverting or steering the flux from the AC and DC bias generators away from the medium, while at the same time allowing for a magnetic coupling of the detecting member of the core 11 (the tip 11a, described above) with the sense winding. And yet further modifications of the present invention may be suggested wherein the AC bias winding $N_1$ is not wound about a cross-member 18, but rather is wound around one of the legs of the control block, or wherein the DC bias generator 15 is constructed as a part of another leg of the control block.

Accordingly, it is clear that this description is not intended to limit the present invention to the details of construction set forth, but, instead, the invention embraces such changes, modifications and equivalents of the various parts and their relations as come within the purview of the appended claims.

What is claimed as new is:

1. A magnetic transducer for sensing and indicating the presence of an external magnetic field, the transducer comprising, in combination:
   a core formed from magnetic permeable material,
   a magnetic flux-conducting ring-shaped field sensor having a gap at one side, connected to the core at a point opposite said gap, said core and field sensor being magnetically isolated from one another, except at the point of contact, by high reluctance slots
   first flux inducing means for establishing a unidirectional magnetic flux within the core to bias said core for operation on a minor hysteresis loop of the core material,
   second flux inducing means for establishing an alternating magnetic flux within the core, said high reluctance slots diverting the unidirectional and alternating flux away from said gap, and
   an output coil wound around the core in which a composite output signal is induced in response to the unidirectional and alternating flux and the magnetic flux of the external magnetic field sensed by said ring sensor.

2. A magnetic transducer for sensing and indicating the presence of an external magnetic field, the transducer comprising, in combination:
   a core formed from magnetic material, the core including a first magnetic circuit and a second magnetic circuit, with a portion of the core being common to the first and second magnetic circuits, said common portion of the core containing high reluctance slots which magnetically isolate the first circuit from the second circuit except at their point of contact,
   first flux inducing means for establishing a unidirectional magnetic flux within the first magnetic circuit in the core to bias said core for operation on a minor hysteresis loop of the core material
   second flux inducing means for establishing an alternating magnetic flux within the first magnetic circuit in the core, said high reluctance slots preventing the alternating and unidirectional flux from entering the second magnetic circuit, and
   said second magnetic circuit being responsive to the external magnetic field
   an output coil wound around the core common to the first and second magnetic circuits in which coil an output signal is induced corresponding to the magnetic flux produced by the external magnetic field to be sensed, within the second magnetic circuit of the core.

3. A magnetic transducer for sensing and indicating the presence of an external magnetic field, said transducer comprising:
   a core formed of magnetically permeable material having an aperture in the lower extremity of said core creating a ring-shaped structure in close proximity to the external magnetic field to be sensed, said ring-shaped structure having a gap therein across which magnetic differentials are produced by the external magnetic field, said core having slots therein on either side of the ring-shaped structure, said slots creating a high reluctance to magnetically isolate said ring-shaped structure from the upper extremity of said core,
   a sense winding wound around said core and through said aperture,
   an AC bias field coil for generating time-varying lines of magnetic flux within said core in response to the application of an AC signal,
   DC bias means for generating DC flux within said core to bias said core for operation on a minor hysteresis loop, and
   a magnetic coupler fabricated from magnetically permeable material and positioned contiguous to said core for guiding said time-varying flux and said DC flux through said sense winding and the upper extremity of said core, said high reluctance slots diverting the time varying and DC flux away from said gap.

4. A magnetic transducer as defined in claim 1, wherein said first flux inducing means comprises a source of DC flux for shifting operation of said core on a minor hysteresis loop.

5. A magnetic transducer as defined in claim 2 wherein said first flux inducing means includes a source of DC flux for shifting operation of said core on a minor hysteresis loop.

* * * * *